United States Patent
Okabe et al.

(10) Patent No.: US 11,889,729 B2
(45) Date of Patent: Jan. 30, 2024

(54) DISPLAY DEVICE

(71) Applicant: SHARP KABUSHIKI KAISHA, Sakai (JP)

(72) Inventors: Tohru Okabe, Sakai (JP); Takeshi Yaneda, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 561 days.

(21) Appl. No.: 17/271,012

(22) PCT Filed: Aug. 31, 2018

(86) PCT No.: PCT/JP2018/032386
§ 371 (c)(1),
(2) Date: Feb. 24, 2021

(87) PCT Pub. No.: WO2020/044546
PCT Pub. Date: Mar. 5, 2020

(65) Prior Publication Data
US 2021/0327996 A1 Oct. 21, 2021

(51) Int. Cl.
*H01L 27/32* (2006.01)
*H10K 59/131* (2023.01)
*H01L 29/786* (2006.01)
(52) U.S. Cl.
CPC ....... *H10K 59/131* (2023.02); *H01L 29/7869* (2013.01)

(58) Field of Classification Search
CPC ............. G02F 1/13306; G02F 1/13452; H01L 29/7869; H10K 59/131
See application file for complete search history.

(56) References Cited

U.S. PATENT DOCUMENTS

2004/0085497 A1* 5/2004 Kawata ............. G02F 1/136213
349/111

FOREIGN PATENT DOCUMENTS

JP 2008-225380 A 9/2008

\* cited by examiner

*Primary Examiner* — Abbas I Abdulselam
(74) *Attorney, Agent, or Firm* — ScienBiziP, P.C.

(57) ABSTRACT

A display device includes a short ring TFT, wherein the short ring TFT includes a semiconductor layer, a first gate electrode, a second gate electrode, a first gate insulating film provided between the semiconductor layer and the first gate electrode, and a second gate insulating film provided between the semiconductor layer and the second gate electrode, one of a pair of adjacent lead-out wiring lines is electrically connected to a source region of the semiconductor layer, the other of the pair of adjacent lead-out wiring lines is electrically connected to a drain region of the semiconductor layer, one of the first gate electrode and the second gate electrode is electrically connected to the source region or the drain region, and the other of the first gate electrode and the second gate electrode is electrically connected to a threshold value control wiring line.

20 Claims, 11 Drawing Sheets

DISPLAY DEVICE

TECHNICAL FIELD

The disclosure relates to a display device.

BACKGROUND ART

In recent years, organic EL display devices in which organic electroluminescence (EL) elements are used and that are of a self-luminous type have attracted attention as a display device that can replace a liquid crystal display device. Here, in the organic EL display device, a plurality of display wiring lines, such as gate lines, source lines, and power source lines, are provided in a display region configured to display images. Furthermore, each of the plurality of display wiring lines extends into a frame region around the display region, and the plurality of extended lead-out wiring lines are often electrically connected to short rings provided in the frame region as countermeasures against static electricity. Here, the short ring refers to a structure in which electrical resistance is provided between wiring lines to discharge static electricity.

For example, PTL 1 discloses an array substrate in which lead-out wiring lines of a gate line and a source line are electrically connected to a short ring, an electrode is provided by the side of the lead-out wiring line, before the short ring is cut and removed, the electrode and the lead-out wiring line are electrically independent, and after the short ring is cut and removed, the electrode and the lead-out wiring line are electrically connected.

CITATION LIST

Patent Literature

PTL 1: JP 2008-225380 A

SUMMARY

Technical Problem

Incidentally, as in PTL 1 described above, since after the short ring is cut and removed, an end face of the lead-out wiring line electrically connected to the short ring is exposed on a cutting surface, an excessive voltage due to static electricity may be applied through the end face of the lead-out wiring line, or the wiring line may deteriorate due to moisture, and the deterioration may spread in the display region.

The disclosure has been made in consideration of this point, and an object thereof is to provide a short ring free from being cut and removed in a display device.

Solution to Problem

To achieve the object described above, a display device according to the disclosure includes a base substrate in which a display region configured to display an image and a frame region around the display region are defined, a light-emitting element provided on a first surface of the base substrate and configuring the display region, a plurality of display wiring lines provided in the display region between the base substrate and the light-emitting element, a plurality of lead-out wiring lines provided in the frame region between the base substrate and the light-emitting element and electrically connected to the plurality of display wiring lines, respectively, and a short ring TFT disposed between a pair of adjacent lead-out wiring lines of the plurality of lead-out wiring lines, wherein the short ring TFT includes a semiconductor layer including a channel region, and a source region and a drain region sandwiching the channel region, a first gate electrode provided closer to the base substrate than the semiconductor layer and overlapping the channel region, a second gate electrode provided closer to the light-emitting element than the semiconductor layer and overlapping the channel region, a first gate insulating film provided between the semiconductor layer and the first gate electrode, and a second gate insulating film provided between the semiconductor layer and the second gate electrode, one of the pair of adjacent lead-out wiring lines is electrically connected to the source region, the other of the pair of adjacent lead-out wiring lines is electrically connected to the drain region, one of the first gate electrode and the second gate electrode is a short circuit gate electrode electrically connected to the source region or the drain region, and the other one of the first gate electrode and the second gate electrode is a threshold value control gate electrode electrically connected to a threshold value control wiring line provided in the frame region.

Advantageous Effects of Disclosure

According to the disclosure, since the short ring TFT disposed between the pair of adjacent lead-out wiring lines includes the semiconductor layer, the first gate electrode provided closer to the base substrate than the semiconductor layer with the first gate insulating film interposed therebetween, and the second gate electrode provided closer to the light-emitting element than the semiconductor layer with the second gate insulating film interposed therebetween, the one of the lead-out wiring lines is electrically connected to the source region of the semiconductor layer, the other of the lead-out wiring lines is electrically connected to the drain region of the semiconductor layer, the one of the first gate electrode and the second gate electrode is electrically connected to the source region or the drain region of the semiconductor layer, and the other of the first gate electrode and the second gate electrode is electrically connected to the threshold value control wiring line, the short ring free from being cut and removed can be provided in the display device.

DESCRIPTION OF EMBODIMENTS

Embodiments of the disclosure will be described below in detail with reference to the drawings. Note that the disclosure is not limited to the embodiments to be described below.

First Embodiment

Figure 1:
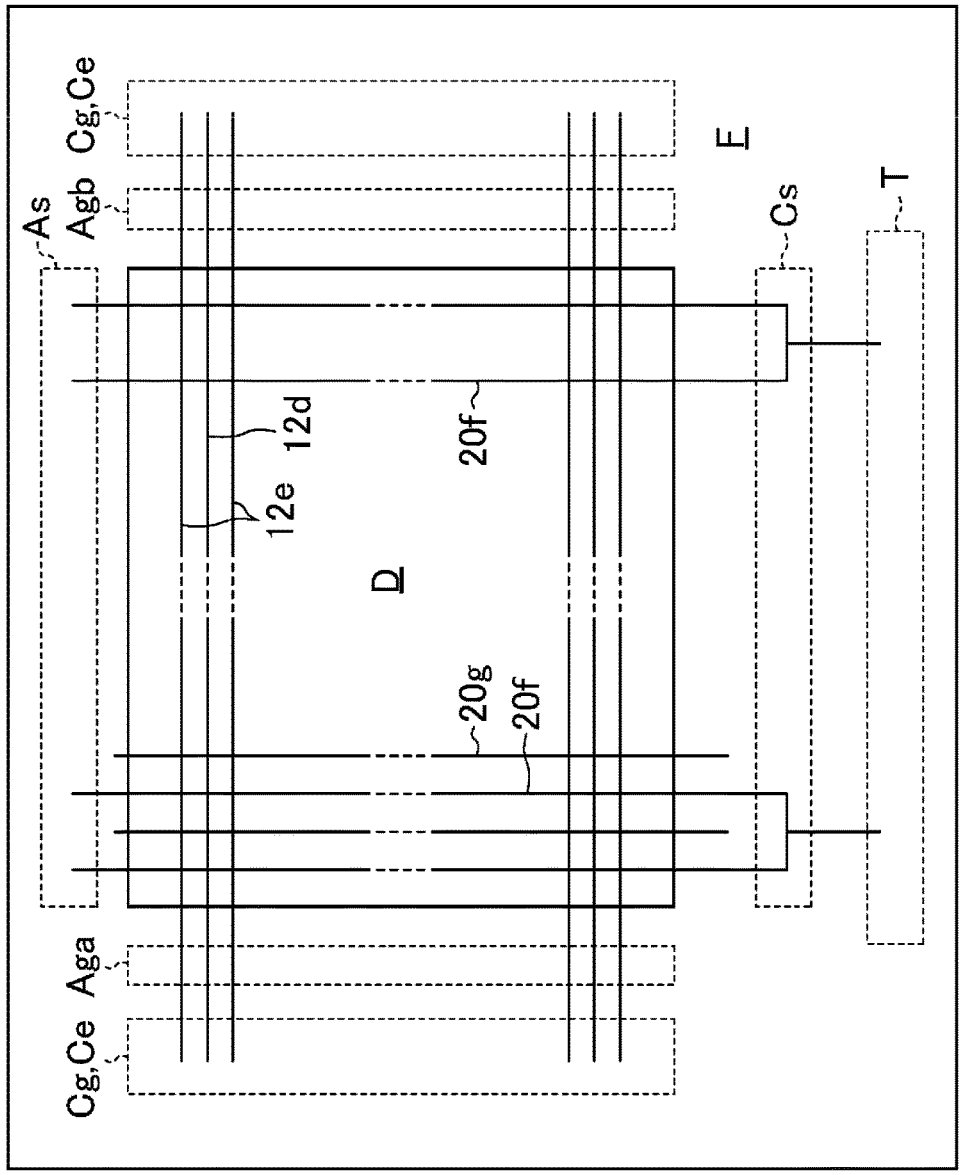
FIG. 1 is a plan view illustrating a schematic configuration of an organic EL display device according to a first embodiment of the disclosure.
Figure 2:
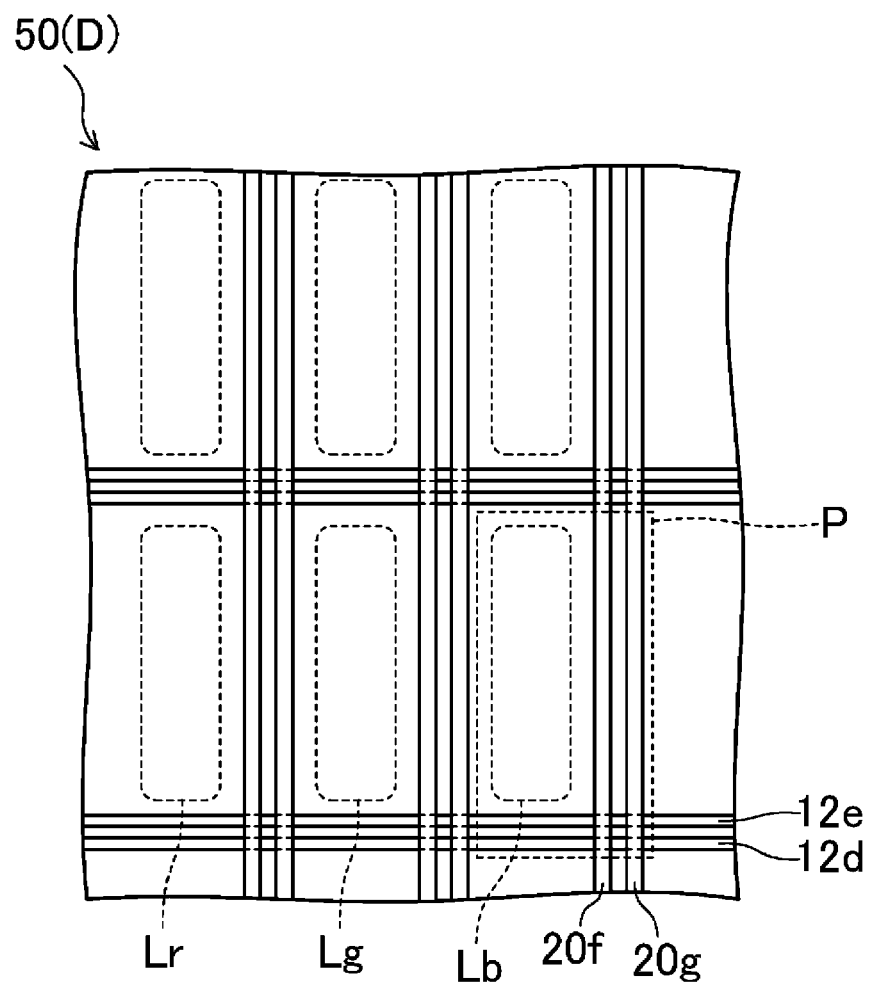
FIG. 2 is a plan view of a display region of the organic EL display device according to the first embodiment of the disclosure.
Figure 3:
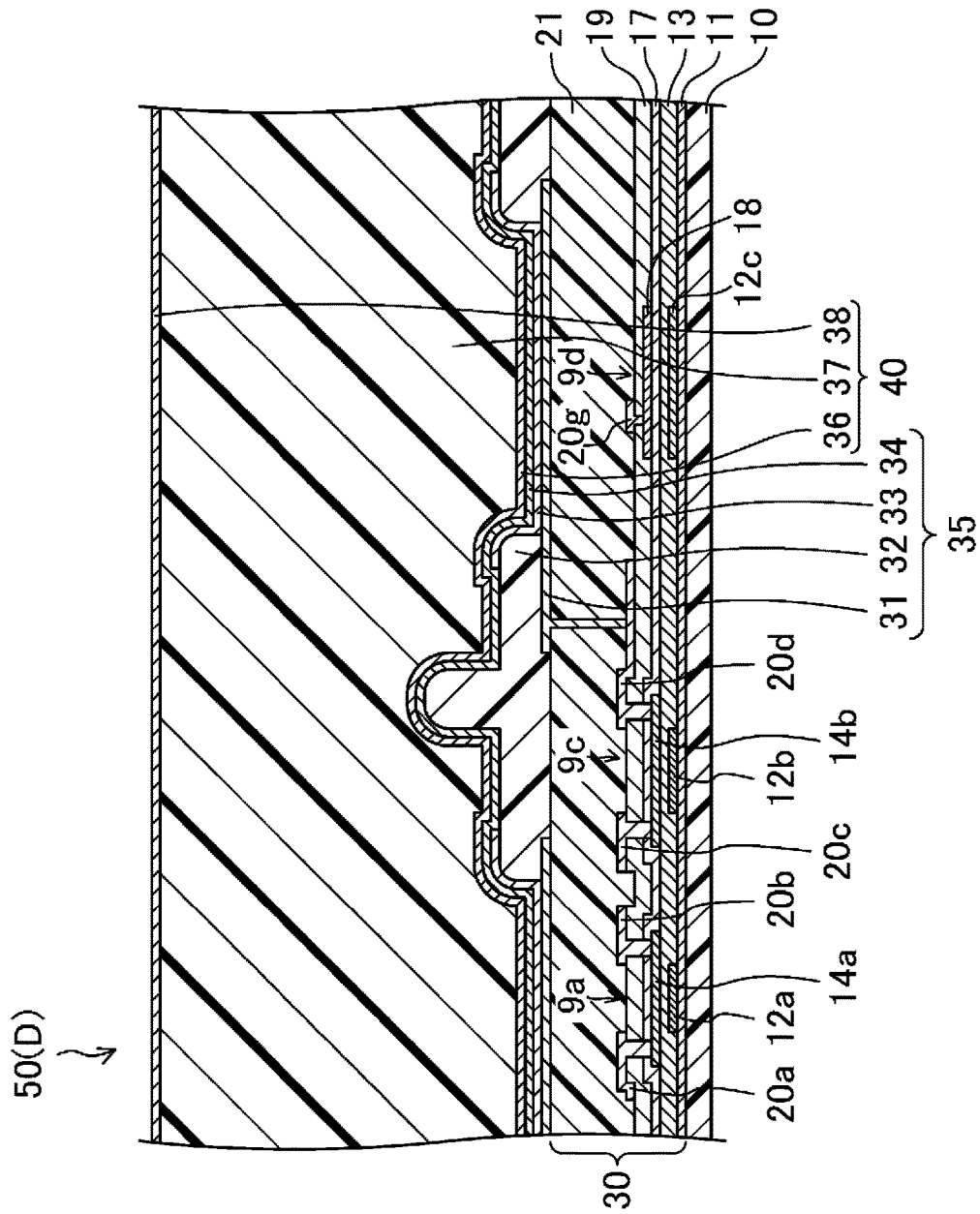
FIG. 3 is a cross-sectional view of the display region of the organic EL display device according to the first embodiment of the disclosure.
Figure 4:
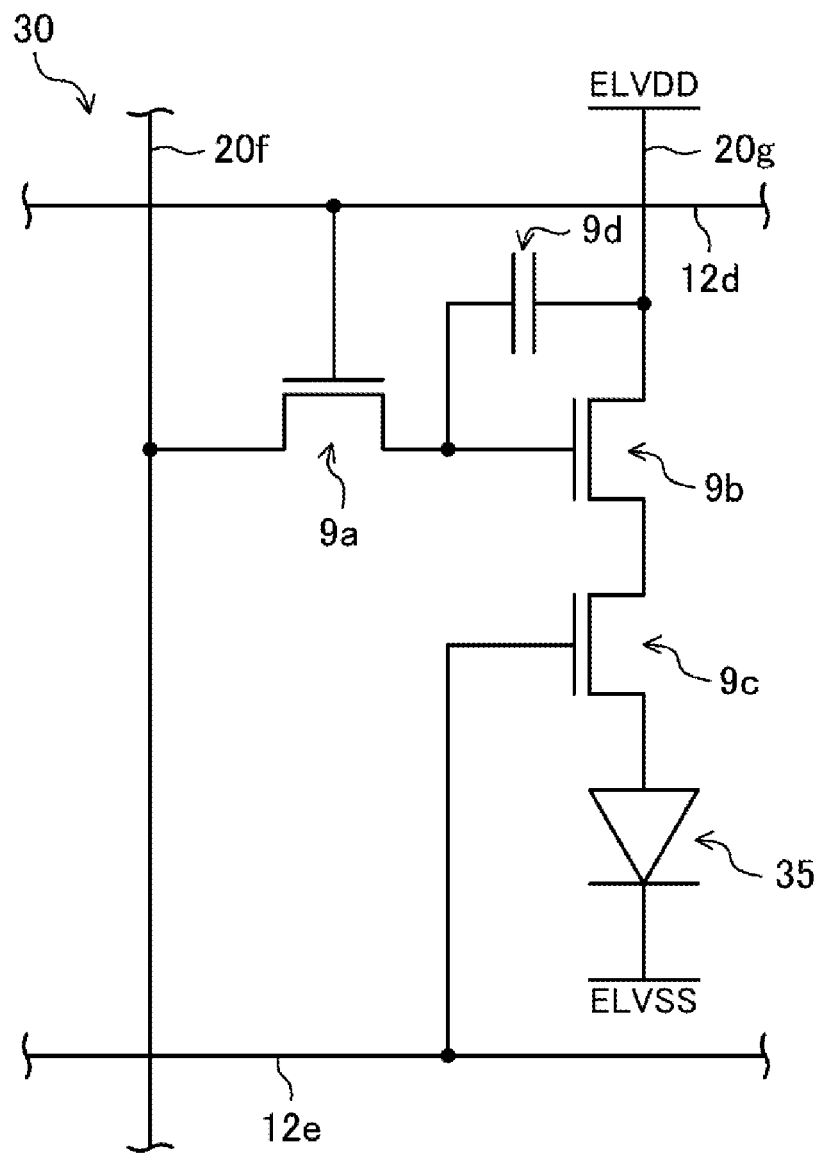
FIG. 4 is an equivalent circuit diagram illustrating a TFT layer configuring the organic EL display device according to the first embodiment of the disclosure.
Figure 5:
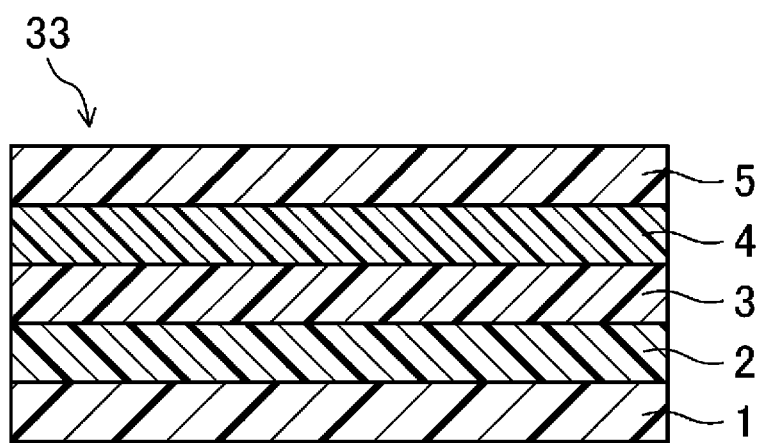
FIG. 5 is a cross-sectional view illustrating an organic EL layer configuring the organic EL display device according to the first embodiment of the disclosure.
Figure 6:
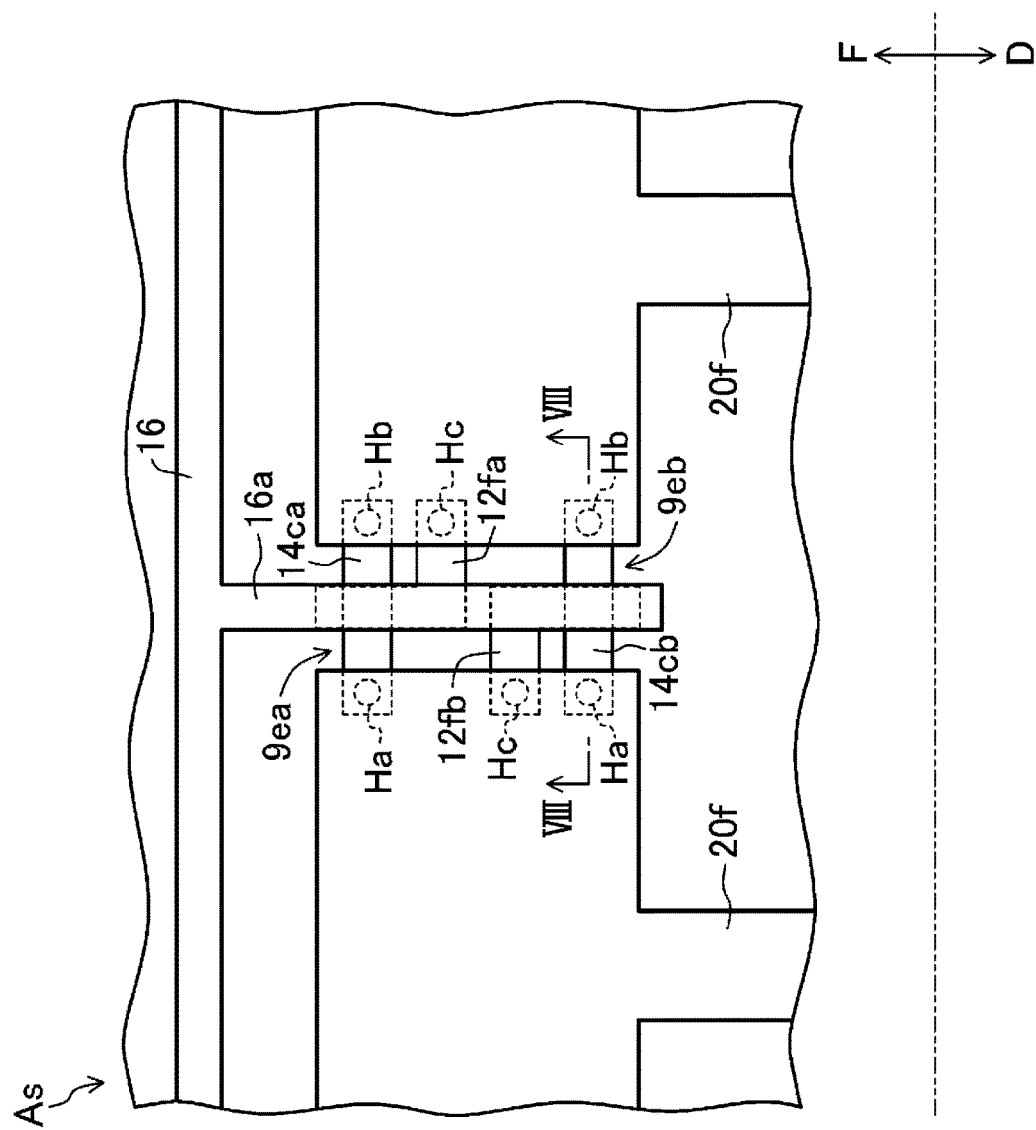
FIG. 6 is a plan view of a main portion of a source short ring TFT forming portion in a frame region of the organic EL display device according to the first embodiment of the disclosure.
Figure 7:
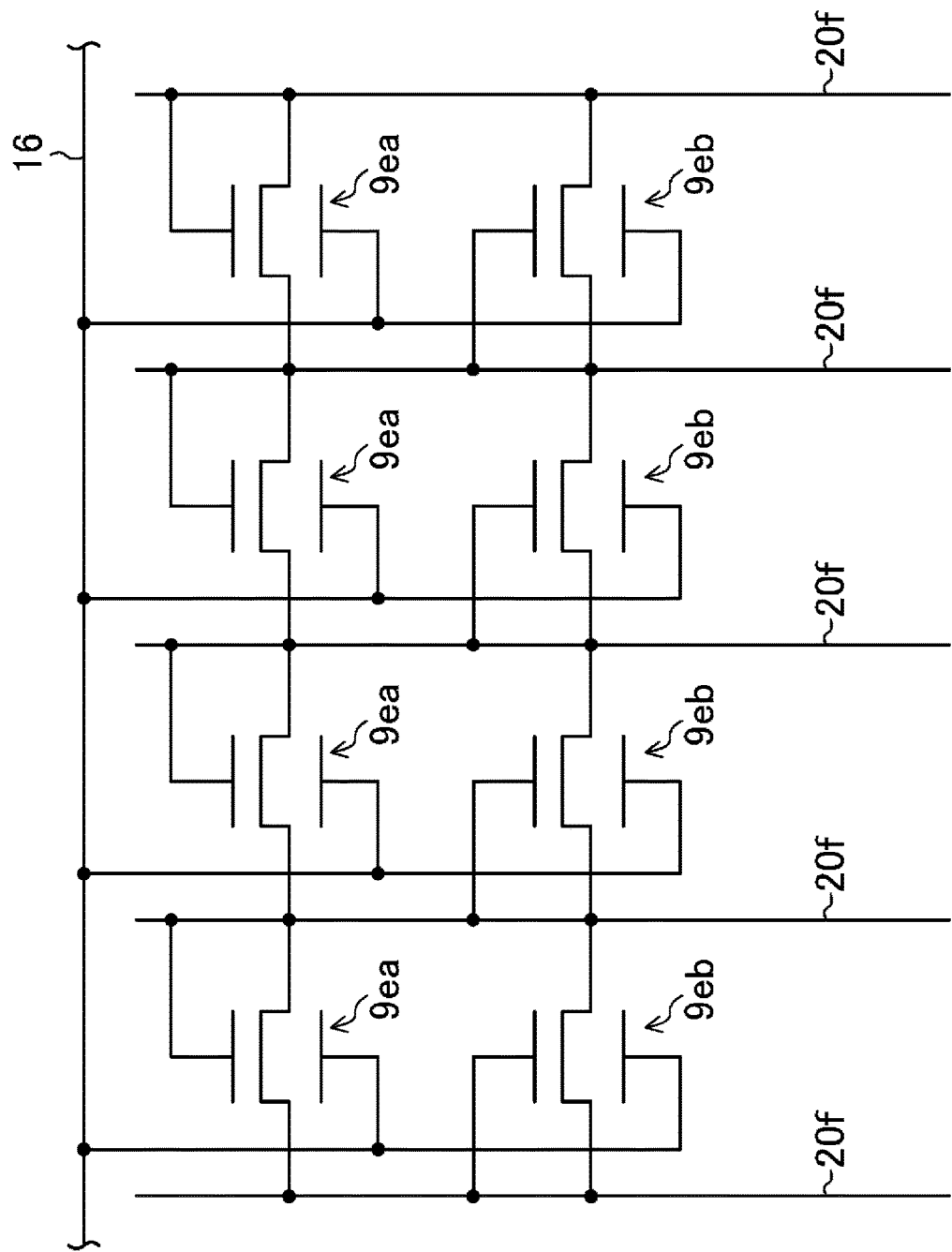
FIG. 7 is an equivalent circuit diagram illustrating a source short ring circuit in the frame region of the organic EL display device according to the first embodiment of the disclosure.
Figure 8:
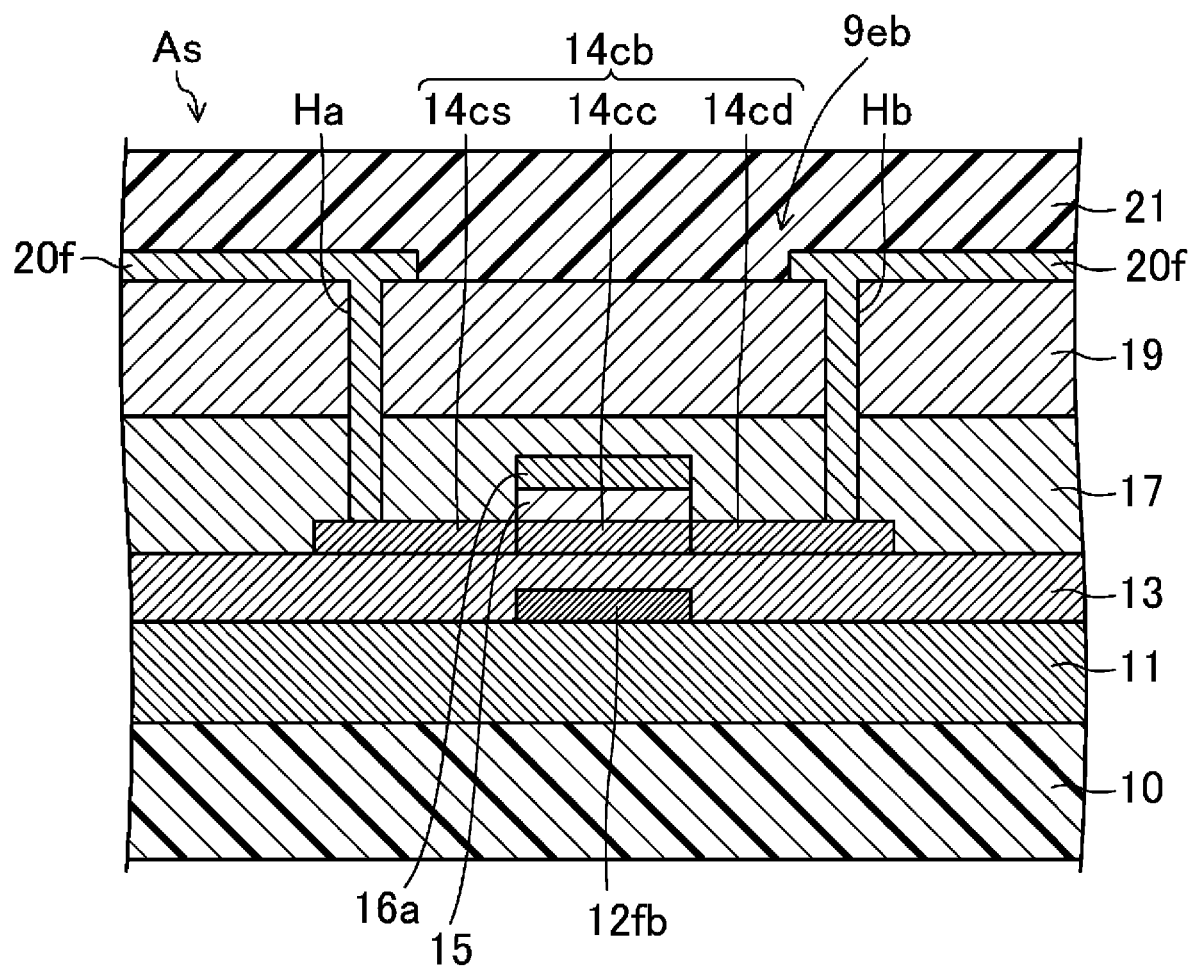
FIG. 8 is a cross-sectional view of a main portion of the source short ring TFT forming portion in the frame region of the organic EL display device taken along a line VIII-VIII in FIG. 6.
Figure 9:
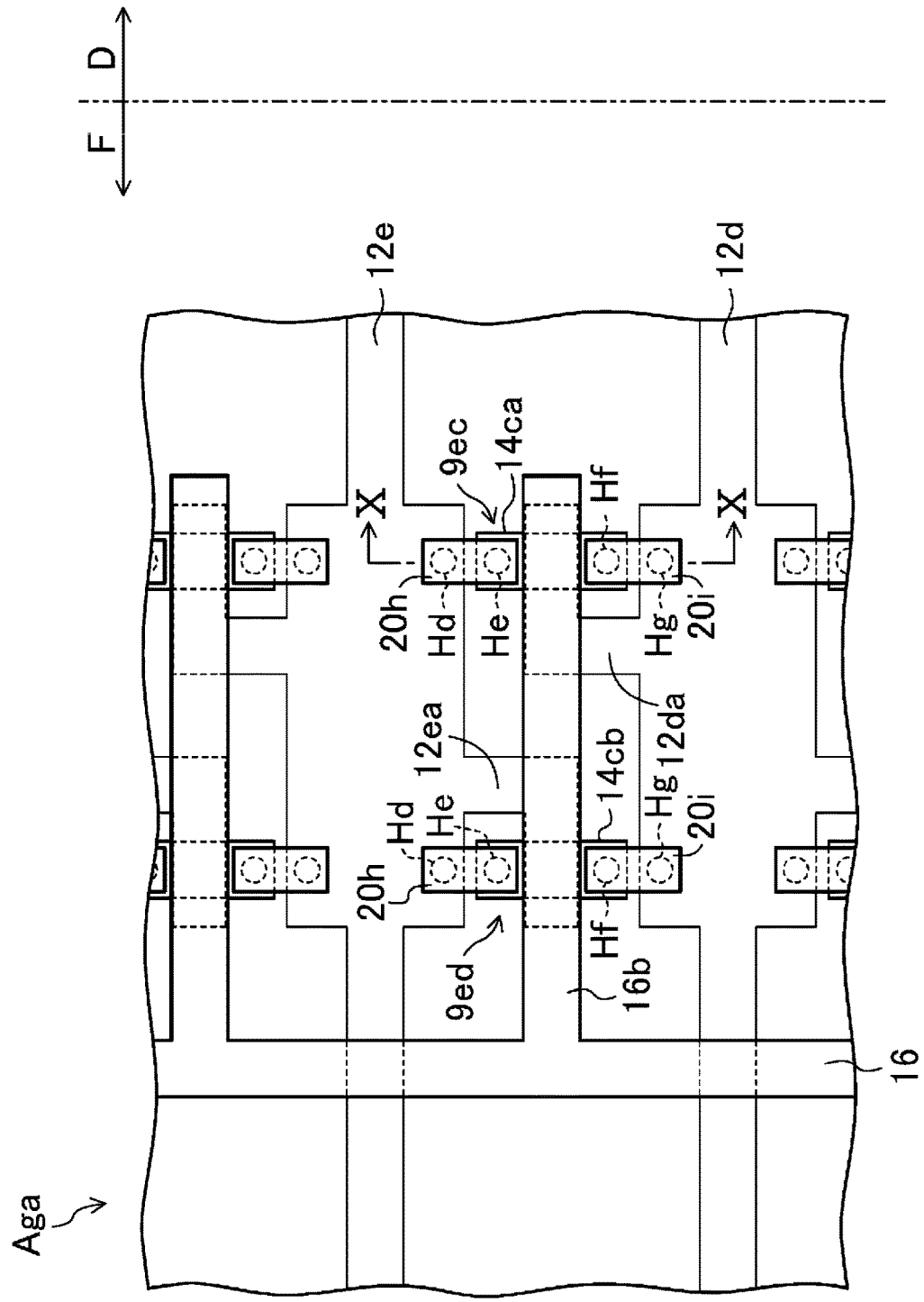
FIG. 9 is a plan view of a main portion of a gate short ring TFT forming portion in the frame region of the organic EL display device according to the first embodiment of the disclosure.
Figure 10:
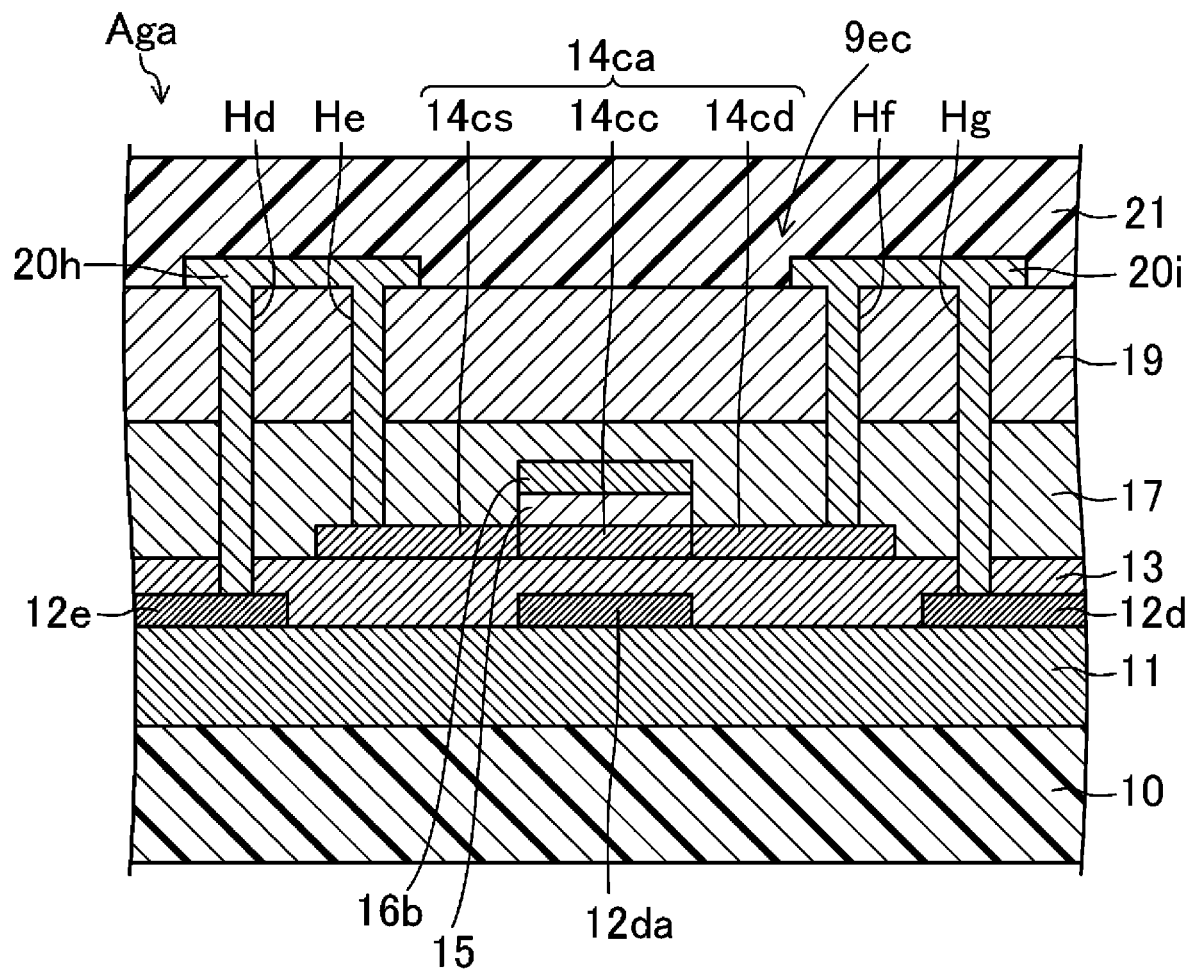
FIG. 10 is a cross-sectional view of a main portion of the gate short ring TFT forming portion in the frame region of the organic EL display device taken along a line X-X in FIG. 9.

FIG. 1 to FIG. 11 illustrate a first embodiment of a display device according to the disclosure. Note that, in each of the following embodiments, an organic EL display device including an organic EL element will be exemplified as a display device including a light-emitting element. Here, FIG. 1 is a plan view illustrating a schematic configuration of an organic EL display device 50 according to the present embodiment. In addition, FIG. 2 is a plan view of a display region D of the organic EL display device 50. Further, FIG. 3 is a cross-sectional view of the display region D of the organic EL display device 50. Further, FIG. 4 is an equivalent circuit diagram illustrating a TFT layer 30 configuring the organic EL display device 50. FIG. 5 is a cross-sectional view illustrating an organic EL layer 33 configuring the organic EL display device 50. Further, FIG. 6 is a plan view of a main portion of a source short ring TFT forming portion As in a frame region F of the organic EL display device 50. Further, FIG. 7 is an equivalent circuit diagram illustrating a source short ring circuit in the frame region F of the organic EL display device 50. Further, FIG. 8 is a cross-sectional view of a main portion of the source short ring TFT forming portion As taken along a line VIII-VIII in FIG. 6. Further, FIG. 9 is a plan view of a main portion of a gate short ring TFT forming portion Aga in the frame region F of the organic EL display device 50. Further, FIG. 10 is a cross-sectional view of a main portion of the gate short ring TFT forming portion Aga taken along an X-X line in FIG. 9.

As illustrated in FIG. 1, the organic EL display device 50 includes, for example, the display region D having a rectangular shape and configured to display an image, and the frame region F provided around the display region D. Note that in the present embodiment, the display region D having the rectangular shape is exemplified, but the rectangular shape includes a substantial rectangular shape such as a shape whose sides are arc-shaped, a shape whose corners are arc-shaped, and a shape in which a part of a side has a notch.

A plurality of subpixels P are disposed in a matrix shape in the display region D, as illustrated in FIG. 2. In addition, in the display region D, for example, a subpixel including a red light-emitting region Lr configured to display a red color, a subpixel P including a green light-emitting region Lg configured to display a green color, and a subpixel P including a blue light-emitting region Lb configured to display a blue color are provided adjacent to one another, as illustrated in FIG. 2. Note that one pixel is configured by, for example, three adjacent subpixels P including the red light-emitting region Lr, the green light-emitting region Lg, and the blue light-emitting region Lb in the display region D.

A terminal portion T is provided in a lower end portion of the frame region F, as illustrated in FIG. 1, and extends in one direction (a horizontal direction in FIG. 1). Additionally, the source short ring TFT forming portion As is provided in an upper end portion of the frame region F, as illustrated in FIG. 1, and extends in one direction (the horizontal direction in FIG. 1). In addition, a gate signal control circuit Cg and a light emission control circuit Ce are provided in both a right end portion and a left end portion of the frame region F, as illustrated in FIG. 1, and extend in one direction (a vertical direction in FIG. 1). Here, the gate short ring TFT forming portion Aga is provided between the gate signal control circuit Cg and light emission control circuit Ce and the display region D on the left side in FIG. 1. Additionally, a gate short ring TFT forming portion Agb is provided between the gate signal control circuit Cg and light emission control circuit Ce and the display region D on the right side in FIG. 1. Further, a demultiplexer circuit Cs is provided between the terminal portion T and the display region D. Note that the gate signal control circuit Cg, the light emission control circuit Ce, and the demultiplexer circuit Cs are provided in a monolithic manner on a resin substrate layer 10 to be described below. In addition, in the present embodiment, the configuration in which the gate short ring TFT forming portions Aga and Agb are provided is exemplified, but a configuration in which one of the gate short ring TFT forming portions Aga and Agb is provided may be applicable. Further, in the configuration in which the gate short ring TFT forming portions Aga and Agb are provided, for example, a short ring TFT for a gate line 12d to be described later may be formed in the gate short ring TFT forming portion Aga, and a short ring TFT for a light emission control line 12e to be described later may be formed in the gate short ring TFT forming portion Agb. Moreover, in the present embodiment, the configuration in which the demultiplexer circuit Cs is provided is exemplified, but the disclosure can also be applied to a configuration in which the demultiplexer circuit Cs is not provided. Furthermore, in the present embodiment, the configuration is exemplified in which the gate short ring TFT forming portion Aga (Agb), the gate signal control circuit Cg, and the light emission control circuit Ce are provided on both the left and right sides of the display region D, but a configuration in which the gate short ring TFT forming portion Aga (Agb), the gate signal control circuit Cg, and the light emission control circuit Ce are provided only on the left side (right side) of the display region D, or a configuration in which the gate short ring TFT forming portion Aga (Agb) is provided only on the left side (right side) of the display region D, and the gate signal control circuit Cg and the light emission control circuit Ce are provided only on the right side (left side) of the display region D may be applicable.

As illustrated in FIG. 3, the organic EL display device 50 includes the resin substrate layer 10 provided as the base substrate, a thin film transistor (TFT) layer 30 provided on the resin substrate layer 10, an organic EL element 35 provided as the light-emitting element configuring the display region D on the TFT layer 30, and a sealing film 40 provided covering the organic EL element 35.

The resin substrate layer 10 is flexible, and is formed, for example, of polyimide resin or the like. Note that polyethylene terephthalate (PET) resin, polyethylene naphthalate (PEN) resin, polyethersulfone (PES) resin, acrylic resin, or the like can be used in addition to the polyimide resin as the resin substrate layer 10.

As illustrated in FIG. 3, the TFT layer 30 includes a base coat film 11 provided on the resin substrate layer 10, a plurality of first TFTs 9a, a plurality of second TFTs 9b (see FIG. 4), a plurality of third TFTs 9c, and a plurality of capacitors 9d provided on the base coat film 11, and a flattening film 21 provided on each of the first TFTs 9a, each of the second TFTs 9b, each of the third TFTs 9c, and each of the capacitors 9d. Here, in the TFT layer 30, as illustrated in FIG. 1, FIG. 2, and FIG. 4, a plurality of gate lines 12d are provided as the display wiring lines and extend parallel to each other in the horizontal direction in the drawings. In addition, in the TFT layer 30, as illustrated in FIG. 1, FIG. 2 and FIG. 4, a plurality of light emission control lines 12e are provided as the display wiring lines and extend parallel to each other in the horizontal direction in the drawings. Note that as illustrated in FIG. 1, FIG. 2, and FIG. 4, each of the light emission control lines 12e is provided adjacent to each of the gate lines 12d. In addition, in the TFT layer 30, as illustrated in FIG. 1, FIG. 2, and FIG. 4, a plurality of source lines 20f are provided as the display wiring lines and extend parallel to each other in the vertical direction in the drawings. Further, in the TFT layer 30, as illustrated in FIG. 1, FIG. 2 and FIG. 4, a plurality of power source lines 20g are provided and extend parallel to each other in the vertical direction in the drawings. Note that, as illustrated in FIG. 1, FIG. 2, and FIG. 4, each of the power source lines 20g is provided adjacent to each of the source lines 20f. In addition, in the TFT layer 30, as illustrated in FIG. 4, each subpixel P includes the first TFT 9a, the second TFT 9b, the third TFT 9c, and the capacitor 9d.

The base coat film 11 is formed of a single-layer film or a layered film of an inorganic insulating film made of, for example, silicon nitride, silicon oxide, silicon oxynitride, or the like.

The first. TFT 9a is provided as a writing control transistor, and is electrically connected to the corresponding gate line 12d, source line 20f, and second TFT 9b in each subpixel P, as illustrated in FIG. 4. In addition, the first TFT 9a includes a gate electrode 12a, a first gate insulating film 13, a semiconductor layer 14a, a first interlayer insulating film 17, a second interlayer insulating film 19, and a source electrode 20a and a drain electrode 20b that are provided in order on the base coat film 11 as illustrated in FIG. 3. Here, the gate electrode 12a is provided in an island shape on the base coat film 11 as illustrated in FIG. 3. In addition, the first gate insulating film 13 is provided covering the gate electrode 12a as illustrated in FIG. 3. In addition, the semiconductor layer 14a is provided overlapping the gate electrode 12a on the gate insulating film 13 as illustrated in FIG. 3, and includes a channel region overlapping the gate electrode 12a, and a source region and a drain region disposed with the channel region interposed between them. Furthermore, the first interlayer insulating film 17 and the second interlayer insulating film 19 are provided in order and cover the channel region of the semiconductor layer 14a as illustrated in FIG. 3. Further, as illustrated in FIG. 3, the source electrode 20a and the drain electrode 20b are provided on the second interlayer insulating film 19 and separated from each other. In addition, the source electrode 20a and the drain electrode 20b are respectively electrically connected to the source region and the drain region of the semiconductor layer 14a, through the respective contact holes formed in a layered film of the first interlayer insulating film 17 and the second interlayer insulating film 19 as illustrated in FIG. 3. Note that the first gate insulating film 13, the first interlayer insulating film 17, and the second interlayer insulating film 19 are configured of a single-layer film or a layered film of an inorganic insulating film made of silicon nitride, silicon oxide, or silicon oxynitride. Furthermore, the semiconductor layer 14a, and a semiconductor layer 14b, a semiconductor layer 14ca, and a semiconductor layer 14cb that will be described later are configured of, for example, an In—Ga—Zn—O based oxide semiconductor. Here, the In—Ga—Zn—O based semiconductor is ternary oxide of indium (In), gallium (Ga), and zinc (Zn), and a ratio (a composition ratio) of each of In, Ga, and Zn is not particularly limited to a specific value. The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor. In place of the In—Ga—Zn—O based semiconductor, another oxide semiconductor may be included. For example, an In—Sn—Zn—O based semiconductor (for example, $In_2O_3$—$SnO_2$—ZnO; InSnZnO) may be included. The In—Sn—Zn—O based semiconductor is ternary oxide of indium (In), tin (Sn), and zinc (Zn). Alternatively, the oxide semiconductor may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, cadmium oxide (CdO), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, $InGaO_3(ZnO)_5$, magnesium zinc oxide ($Mg_xZn_{1-x}O$), and cadmium zinc oxide ($Cd_xZn_{1-x}O$). As the Zn—O based semiconductor, a semiconductor in a non-crystalline (amorphous) state of ZnO to which one kind or a plurality of kinds of impurity elements among group 1 elements, group 13 elements, group 14 elements, group 15 elements, group 17 elements, and the like are added, a polycrystalline state, or a microcrystalline state in which the non-crystalline state and the polycrystalline state are mixed, or a semiconductor to which no impurity element is added can be used.

The second TFT 9b is provided as a drive transistor, and is electrically connected to the corresponding first TFT 9a, power source line 20g, and third TFT 9c in each subpixel P, as illustrated in FIG. 4. Note that the second TFT 9b has substantially the same structure as those of the first TFT 9a and the third TFT 9c to be described later.

The third TFT 9c is provided as a light emission control transistor and is electrically connected to the corresponding second TFT 9b, organic EL element 35, and light emission control line 12e in each subpixel P, as illustrated in FIG. 4. In addition, the third TFT 9c includes a gate electrode 12b, the first gate insulating film 13, the semiconductor layer 14b, the first interlayer insulating film 17, the second interlayer insulating film 19, and a source electrode 20c and a drain electrode 20d that are provided in order on the base coat film 11 as illustrated in FIG. 3. Here, the gate electrode 12b is provided in an island shape on the base coat film 11 as illustrated in FIG. 3. In addition, the first gate insulating film 13 is provided covering the gate electrode 12b as illustrated in FIG. 3. In addition, the semiconductor layer 14b is provided overlapping the gate electrode 12b on the gate insulating film 13 as illustrated in FIG. 3, and includes a channel region overlapping the gate electrode 12b, and a source region and a drain region disposed with the channel region interposed between them. Furthermore, the first interlayer insulating film 17 and the second interlayer insulating film 19 are provided in order and cover the channel region of the semiconductor layer 14b as illustrated in FIG. 3. Further, as illustrated in FIG. 3, the source electrode 20c and the drain electrode 20d are provided on the second interlayer insulating film 19 and separated from each other. In addition, the source electrode 20c and the drain electrode 20d are respectively electrically connected to the source region and the drain region of the semiconductor layer 14b, through the respective contact holes formed in the layered film of the first interlayer insulating film 17 and the second interlayer insulating film 19 as illustrated in FIG. 3.

Note that, in the present embodiment, the first TFT 9a, the second TFT 9b, and the third TFT 9c that each are a TFT of a bottom gate type are exemplified, but the first TFT 9a, the second TFT 9b, and the third TFT 9c may each be a TFT of a top gate type.

The capacitor 9d is electrically connected to the corresponding first TFT 9a and power source line 20g in each subpixel P, as illustrated in FIG. 4. Here, the capacitor 9d includes a lower conductive layer 12c formed of the same material in the same layer as the gate electrode 12a and the like, the first gate insulating film 13 and the first interlayer insulating film 17 that are provided covering the lower conductive layer 12c, and an upper conductive layer 18 provided on the first interlayer insulating film 17 and overlapping the lower conductive layer 12c as illustrated in FIG. 3. Note that, as illustrated in FIG. 3, the upper conductive layer 18 is electrically connected to the power source line 20g.

The flattening film 21 is formed of, for example, an organic resin material such as polyimide resin.

The organic EL element 35 includes, as illustrated in FIG. 3, a plurality of first electrodes 31, an edge cover 32, a plurality of organic EL layers 33, and a second electrode 34 that are provided in order on the flattening film 21.

The plurality of first electrodes 31 are provided in a matrix shape on the flattening film 21 and correspond to a plurality of subpixels P as illustrated in FIG. 3. Further, as illustrated in FIG. 3, each of the first electrodes 31 is electrically connected to the drain electrode 20d of each of the third TFTs 9c through a contact hole formed in the flattening film 21. Further, the first electrode 31 functions to inject holes (positive holes) into the organic EL layer 33. Further, the first electrode 31 is preferably formed of a material having a large work function to improve the efficiency of hole injection into the organic EL layer 33. Here, examples of materials constituting the first electrode 31 include metallic materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Nib), lithium fluoride (LiF), platinum (Pt), palladium (Pd), molybdenum (Mo), iridium (Ir), and tin (Sn). Further, examples of the materials constituting the first electrode 31 may include alloy such as astatine (At)/astatine oxide (AtO$_2$). Furthermore, examples of the materials constituting the first electrode 31 may include electrically conductive oxide such as tin oxide (SnO), zinc oxide (ZnO), indium tin oxide (ITO), and indium zinc oxide (IZO). Additionally, the first electrode 31 may be formed by layering a plurality of layers formed of any of the materials described above. Note that, examples of compound materials having a large work function include indium tin oxide (ITO) and indium zinc oxide (IZO).

As illustrated in FIG. 3, the edge cover 32 is provided in a lattice pattern and covers a peripheral portion of each first electrode 31. Here, examples of a material constituting the edge cover 32 include positive-working photosensitive resin such as polyimide resin, acrylic resin, polysiloxane resin, and novolak resin.

A plurality of organic EL layers 33 are disposed on the respective first electrodes 31, and is provided in a matrix shape corresponding to the plurality of subpixels P as illustrated in FIG. 3. Here, as illustrated in FIG. 5, each organic EL layer 33 includes a hole injection layer 1, a hole transport layer 2, a light-emitting layer 3, an electron transport layer 4, and an electron injection layer 5 that are provided in order on the first electrode 31.

The hole injection layer 1 is also referred to as an anode buffer layer, and functions to reduce an energy level difference between the first electrode 31 and the organic EL layer 33 to thereby improve the efficiency of hole injection into the organic EL layer 33 from the first electrode 31. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 31 to the organic EL layer 33. Here, examples of materials constituting the hole transport layer 2 include porphyrin derivatives, aromatic tertiary, amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where holes and electrons are injected from the first electrode 31 and the second electrode 34, respectively, and the holes and the electrons recombine, when a voltage is applied via the first electrode 31 and the second electrode 34. Here, the light-emitting layer 3 is formed of a material having great light-emitting efficiency. Moreover, examples of materials constituting the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyryibenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate migration of electrons to the light-emitting layer 3 efficiently. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds, as organic compounds.

The electron injection layer 5 functions to reduce an energy level difference between the second electrode 34 and the organic EL layer 33 to thereby improve the efficiency of electron injection into the organic EL layer 33 from the second electrode 34, and this function allows the drive voltage of the organic EL element 35 to be reduced. Note that the electron injection layer 5 is also referred to as a cathode buffer layer. Here, examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

As illustrated in FIG. 3, the second electrode 34 is provided covering each of the organic EL layer 33 and the edge cover 32. Further, the second electrode 34 functions to inject electrons into the organic EL layer 33. Further, the second electrode 34 is preferably formed of a material having a small work function to improve the efficiency of electron injection into the organic EL layer 33. Here, examples of materials constituting the second electrode 34 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further, the second electrode 34 may be formed of alloy such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (Lin/calcium (Ca)/ aluminum (Al). Further, the second electrode 34 may be formed of an electrically conductive oxide such as tin oxide (SnO), zinc oxide (ZnO), indium tin oxide (ITO), and indium zinc oxide (IZO). Further, the second electrode 34 may be formed by layering a plurality of layers made of any of the materials described above. Note that, examples of materials having a small work function include magnesium (Mg), lithium (Li), lithium fluoride (Lin, magnesium (Mg)/ copper (Cu), magnesium (Mg)/silver (Ag), sodium (Na)/ potassium (K), lithium (Li)/aluminum (Al), lithium (Li)/ calcium (Ca)/aluminum (Al), and lithium fluoride (LiF)/ calcium (Ca)/aluminum (Al).

As illustrated in FIG. 3 and FIG. 6, the sealing film 40 includes a first inorganic film 36 provided covering the second electrode 34, an organic film 37 provided on the first inorganic film 36, and a second inorganic film 38 provided covering the organic film 37, and functions to protect the organic EL layer 33 from moisture, oxygen, and the like. Here, the first inorganic film 36 and the second inorganic film 38 are formed of an inorganic material such as silicon oxide ($SiO_2$), aluminum oxide ($Al_2O_3$), silicon nitride (SiNx (x is a positive number)) such as trisilicon tetranitride ($Si_3N_4$), or silicon carbonitride (SiCN). Further, the organic film 37 is formed of, for example, an organic material such as acrylic resin, polyurea resin, parylene resin, polyimide resin, and polyimide resin.

Also, in the organic EL display device 50, one end portion of each of the plurality of source lines 20f (the upper side in the drawings) extends to the source short ring TFT forming portion As in the frame region F as illustrated in FIG. 1, FIG. 6, and FIG. 7, which serves as a plurality of lead-out wiring lines electrically connected to the plurality of source lines 20f. Here, in the source short ring TFT forming portion As, as illustrated in FIG. 6 and FIG. 7, a first short ring TFT 9ea and a second short ring TFT 9eb are disposed between a pair of adjacent source lines 20f. Note that in the present embodiment, the configuration is exemplified in which the two short rings TFT 9ea and TFT 9eb are provided between the pair of adjacent source lines 20f, but at least three short ring TFTs may be disposed between the pair of adjacent source lines 20f.

As illustrated in FIG. 6, the first short ring TFT 9ea includes a semiconductor layer 14ca, a first gate electrode 12fa provided closer to the resin substrate layer 10 than the semiconductor layer 14ca, a second gate electrode 16a provided closer to the organic EL element 35 than the semiconductor layer 14ca, the first gate insulating film 13 (see FIG. 8) provided between the semiconductor layer 14ca and the first gate electrode 12fa, and the second gate insulating film 15 (see FIG. 8) provided between the semiconductor layer 14ca and the second gate electrode 16a. Here, the semiconductor layer 14ca includes a channel region 14cc (see FIG. 8) provided overlapping the first gate electrode 12fa and the second gate electrode 16a, and a source region 14cs and a drain region 14cd (see FIG. 8) provided sandwiching the channel region 14cc (see FIG. 8). In addition, as illustrated in FIG. 6, one (on the left side in the drawing) of the pair of adjacent source lines 20f is electrically connected to the source region 14cs of the semiconductor layer 14ca through a contact hole Ha formed in the layered film of the first interlayer insulating film 17 and the second interlayer insulating film 19 (see FIG. 8). In addition, as illustrated in FIG. 6, the other (on the right side in the drawing) of the pair of adjacent source lines 20f (on the right side in the drawing) is electrically connected to the drain region 14cd of the semiconductor layer 14ca through a contact hole Hb formed in the layered film of the first interlayer insulating film 17 and the second interlayer insulating film 19 (see FIG. 8). Also, as illustrated in FIG. 6, the first gate electrode 12fa is a short circuit gate electrode electrically connected to the other (on the right side in the drawing) of the pair of adjacent source lines 20f through a contact hole He formed in the layered film of the first gate insulating film 13, the first interlayer insulating film 17, and the second interlayer insulating film 19. Further, the second gate electrode 16a is a threshold value control gate electrode electrically connected to a threshold value control wiring line 16 provided in a frame shape in the frame region F. Note that the second gate electrode 16a is a branch wiring line in which the threshold value control wiring line 16 branches toward the first short ring TFT 9ea and the second short ring TFT 9eb. In addition, in the first short ring TFT 9ca, a first short ring TFT 9ec to be described below, and the second short ring TFTs 9eb and led, the source region 14cs and the drain region 14cd are only denoted in order to distinguish both regions for convenience, and the source region 14cs and the drain region 14cd may be interchanged with each other.

As illustrated in FIG. 6 and FIG. 8, the second short ring TFT 9eb includes the semiconductor layer 14cb, a first gate electrode 121b provided closer to the resin substrate layer 10 than the semiconductor layer 14cb, the second gate electrode 16a provided closer to the organic EL element 35 than the semiconductor layer 14cb, the first gate insulating film 13 provided between the semiconductor layer 14cb and the first gate electrode 12fb, and the second gate insulating film 15 provided between the semiconductor layer 14cb and the second gate electrode 16a. Here, as illustrated in FIG. 8, the semiconductor layer 14cb includes the channel region 14cc provided overlapping the first gate electrode 12fb and the second gate electrode 16a, and the source region 14cs and the drain region 14cd provided sandwiching the channel region 14cc. Additionally, as illustrated in FIG. 6 and FIG. 8, one of the pair of adjacent source lines 20f (on the left side in the drawing) is electrically connected to the source region 14cs of the semiconductor layer 14cb through the contact hole Ha formed in the layered film of the first interlayer insulating film 17 and the second interlayer insulating film 19. In addition, as illustrated in FIG. 6 and FIG. 8, the other of the pair of adjacent source lines 20f (on the right side in the drawing) is electrically connected to the drain region 14cd of the semiconductor layer 14cb through the contact hole Hb formed in the layered film of the first interlayer insulating film 17 and the second interlayer insulating film 19. Additionally, as illustrated in FIG. 6, the first gate electrode 12fb is a short circuit gate electrode electrically connected to one of the pair of adjacent source lines 20f (on the left side in the drawing) through the contact hole formed in the layered film of the first gate insulating film 13, the first interlayer insulating film 17, and the second interlayer insulating film 19. Further, the second gate electrode 16a is a threshold value control gate electrode electrically connected to the threshold value control wiring line 16 provided in the frame shape in the frame region F. Note that the second gate electrode 16a is provided shared by the first short ring TFT lea and the second short ring TFT 9cb, as illustrated in FIG. 6.

In addition, in the organic EL display device 50, as illustrated in FIG. 1, the other end portion of each of the plurality of source lines 20f (on the lower side in the drawing) extends to the demultiplexer circuit Cs in the frame region F, and then one line selected from two adjacent source lines extends to the terminal portion T. Note that, in the present embodiment, the demultiplexer circuit Cs provided for each two adjacent source lines 20f and configured to transmit one data signal to either of two source lines is exemplified, but the demultiplexer circuit Cs may be provided for each three adjacent source lines 20f and transmit one data signal to one of three source lines.

In addition, in the organic EL display device 50, both ends of each of the plurality of power source lines 20g extend to the frame region F, and are electrically connected to a frame wiring line (not illustrated) that is provided in the frame region F and that is to be input with a high power supply voltage (ELVDD).

In addition, as illustrated in FIG. 1, in the organic EL display device 50, both ends of each of the plurality of gate lines 12d extend to the gate short ring TFT forming portion Aga and the gate short ring TFT forming portion Agb in the frame region F, which serve as a plurality of lead-out wiring lines electrically connected to the plurality of gate lines 12d. In addition, as illustrated in FIG. 1, in the organic EL display device 50, both ends of each of the plurality of light emission control lines 12e extend to the gate short ring TFT forming portion Aga and the gate short ring TFT forming portion Agb in the frame region F, which serve as a plurality of lead-out wiring lines electrically connected to the plurality of light emission control lines 12e. Note that the gate short ring circuit has a similar structure to that of the source short ring circuit (see FIG. 7). Here, as illustrated in FIG. 9, in the gate short ring TFT forming portion Aga (and the gate short ring TFT forming portion Agb), the first short ring TFT 9ec and the second short ring TFT 9ed are disposed between the gate line 12d and the light emission control line 12e that are adjacent to each other. Note that in the present embodiment, the configuration is exemplified in which the two short ring TFTs 9ec and 9ed are provided between the gate line 12d and the light emission control line 12e that are adjacent to each other, but at least three short ring TFTs may be disposed between the gate line 12d and the light emission control line 12e that are adjacent to each other.

As illustrated in FIG. 9 and FIG. 10, the first short ring TFT 9ec includes the semiconductor layer 14ca, a first gate electrode 12da provided closer to the resin substrate layer 10 than the semiconductor layer 14ca, the second gate electrode 16b provided closer to the organic EL element 35 than the semiconductor layer 14ca, the first gate insulating film 13 provided between the semiconductor layer 14ca and the first gate electrode 12da, and the second gate insulating film 15 provided between the semiconductor layer 14ca and the second gate electrode 16b. Here, as illustrated in FIG. 10, the semiconductor layer 14ca includes the channel region 14cc provided overlapping the first gate electrode 12da and the second gate electrode 16b, and the source region 14cs and the drain region 14cd provided sandwiching the channel region 14cc. Additionally, as illustrated in FIG. 9 and FIG. 10, the light emission control line 12e is electrically connected to the source region 14cs of the semiconductor layer 14ca through a contact hole He formed in the layered film of the first interlayer insulating film 17 and the second interlayer insulating film 19, the source contact layer 20h, and the contact hole Hd formed in a layered film of the first gate insulating film 13, the first interlayer insulating film 17, and the second interlayer insulating film 19. Additionally, as illustrated in FIG. 9 and FIG. 10, the gate line 12d is electrically connected to the drain region 14cd of the semiconductor layer 14ca through a contact hole Hf formed in the layered film of the first interlayer insulating film 17 and the second interlayer insulating film 19, a source contact layer 20i, and a contact hole fig formed in the layered film of the first gate insulating film 13, the first interlayer insulating film 17, and the second interlayer insulating film 19. In addition, as illustrated in FIG. 9, the first gate electrode 12da is a portion where the gate line 12d protrudes laterally in an L shape, and is a short circuit gate electrode electrically connected to the gate line 12d. Additionally, the second gate electrode 16b is a threshold value control gate electrode electrically connected to the threshold value control wiring line 16 provided in a frame shape in the frame region F. Note that the second gate electrode 16b is a branch wiring line in which the threshold value control wiring line 16 branches toward the first short ring TFT 9ec and the second short ring TFT 9ed.

As illustrated in FIG. 9, the second short ring TFT 9ed includes the semiconductor layer 14cb, a first gate electrode 12ea provided closer to the resin substrate layer 10 than the semiconductor layer 14cb, the second gate electrode 16b provided closer to the organic EL element 35 than the semiconductor layer 14cb, the first gate insulating film 13 (see FIG. 10) provided between the semiconductor layer 14cb and the first gate electrode 12ea, and the second gate insulating film 15 (see FIG. 10) provided between the semiconductor layer 14cb and the second gate electrode 16b. Here, the semiconductor layer 14cb includes the channel region 14cc (see FIG. 10) provided overlapping the first gate electrode 12ea and the second gate electrode 16b, and the source region 14cs (see FIG. 10) and the drain region 14cd (see FIG. 10) that are provided sandwiching the channel region 14cc, Additionally, as illustrated in FIG. 9, the light emission control line 12e is electrically connected to the source region 14cs of the semiconductor layer 14cb through the contact hole He formed in the layered film of the first interlayer insulating film 17 and the second interlayer insulating film 19, the source contact layer 20h, and the contact hole Hd formed in the layered film of the first gate insulating film 13, the first interlayer insulating film 17, and the second interlayer insulating film 19. Additionally, as illustrated in FIG. 9, the gate line 12d is electrically connected to the drain region 14cd of the semiconductor layer 14cb through the contact hole Hf formed in the layered film of the first interlayer insulating film 17 and the second interlayer insulating film 19, the source contact layer 20i, and the contact hole Hg formed in the layered film of the first gate insulating film 13, the first interlayer insulating film 17, and the second interlayer insulating film 19. In addition, as illustrated in FIG. 9, the first gate electrode 12ea is a portion where the light emission control line 12e protrudes laterally in an L shape, and is a short circuit gate electrode electrically connected to the light emission control line 12e. Additionally, the second gate electrode 16b is a threshold value control gate electrode electrically connected to the threshold value control wiring line 16 provided in the frame shape in the frame region F. Note that, as illustrated in FIG. 9, the second gate electrode 16b is provided shared by the first short ring TFT 9ec and the second short ring TFT 9ed.

Also, the first short ring TFTs 9ea and 9ec and the second short ring TFTs 9eb and 9ed are n-type transistors, and a negative voltage such as a low power supply voltage (EL-DSS) is input to the threshold value control wiring line 16. Here, the degree of threshold value control depends on a ratio between an electrostatic capacitance between the short circuit gate electrode and the semiconductor layer, and an electrostatic capacitance between the threshold value control gate electrode and the semiconductor layer. In other words, as the electrostatic capacitance between the threshold value control gate electrode and the semiconductor layer is greater than the electrostatic capacitance between the short circuit gate electrode and the semiconductor layer, the short ring TFT can be turned off with the smaller threshold value control voltage. To achieve this, for example, a film thickness of the first gate insulating film 13 between the short circuit gate electrode (12fa, 12fb, 12da, and 12ea) and the semiconductor layer (14ca and 14cb) may be made greater than a film thickness of the second gate insulating film 15 between the threshold value control gate electrode (16a and 16b) and the semiconductor layer (14ca and 14cb), or a length of the threshold value control gate electrode (16a and 16b) in a channel direction (the horizontal direction in FIG. 6, the vertical direction in FIG. 9) may be made greater than a length of the short circuit gate electrode (12fa, 12fb, 12da, and 12ea) in the channel direction.

Figure 11:
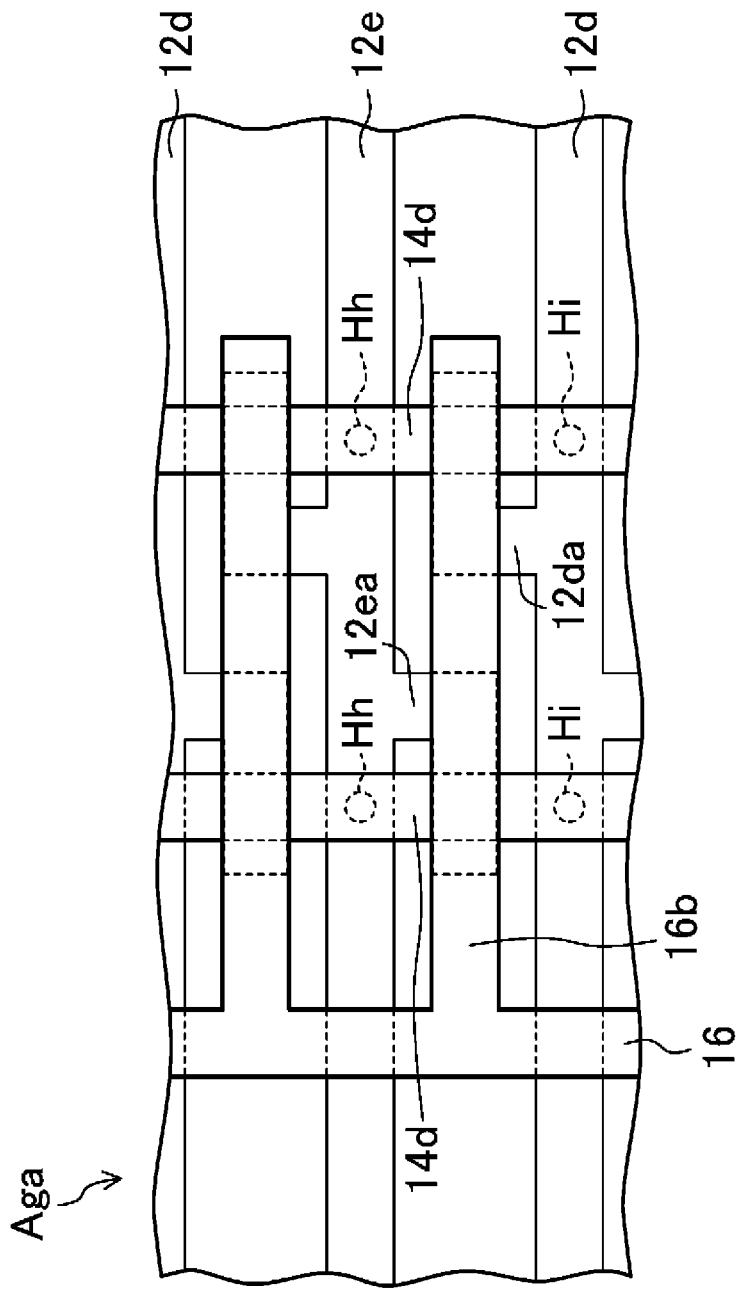
FIG. 11 is a plan view of a main portion of the gate short ring TFT forming portion in the frame region of the organic EL display device according to the first embodiment of the disclosure in a modified example.

Note that, in the present embodiment, the configuration in which the semiconductor layers 14ca and 146 are provided in an island shape between a pair of adjacent lead-out wiring lines is exemplified, but, as illustrated in FIG. 11, a semiconductor layer 14d may be provided shared by at least three adjacent lead-out wiring lines (the gate line 12d, the light emission control line 12e, and the gate line 12d). Here, FIG. 11 is a plan view of a main portion of the gate short ring TFT forming portion Aga in a modified example. In this modified example, as contact holes configured to electrically connect the semiconductor layer 14d, the gate line 12d, and the light emission control line 12e, only contact holes Hi and Hh are required, so the semiconductor layer 14d, the gate line 12d, and the light emission control line 12e can be made to be conducted with a small area, and a pitch between the wiring lines can be made narrower. Furthermore, this modified example can also be applied to the short ring TFT between the adjacent source lines 20f.

Further, in the present embodiment, the wiring structure in which the display wiring lines extend directly to the frame region F is exemplified, but the display wiring lines may extend by switching to another conductive layer in the frame region F.

Further, in the present embodiment, the configuration in which the source short ring TFT forming portion As is provided on a side facing one side of the frame region F in which the terminal portion T exists is exemplified, but the source short ring TFT forming portion As may be provided between the display region D and the demultiplexer circuit Cs. In this case, since it is necessary to avoid a high power supply voltage trunk wiring line (not illustrated) orthogonal to the plurality of power source lines 20g to form the short ring TFTs 9ea and 9eb, the source short ring TFT forming portion As is preferably provided on an opposite side of the terminal portion T. Note that since the plurality of power source lines 20g are electrically connected to the high power supply voltage trunk wiring line, a countermeasure against static electricity by the short ring TFT is unnecessary.

In each subpixel P of the organic EL display device 50 described above, in a case where the first TFT 9a is turned on, a data signal is written into the gate electrode of the second TFT 9b and the capacitor 9d through the source line 20f in response to the gate signal being input to the first TFT 9a through the gate line 12d, the third TFT 9c is then turned on, and a current corresponding to the gate voltage of the second TFT 9b is supplied from the power source line 20g to the organic EL layer 33 in response to the light emission control signal being input to the third TFT 9c through the light emission control line 12e, the light-emitting layer 3 of the organic EL layer 33 emits light to display an image. Note that, in the organic EL display device 50, even when the first. TFT 9a is turned off, the gate voltage of the second TFT 9b is held by the capacitor 9d, and thus, light emission of the light-emitting layer 3 is kept in each subpixel P until a gate signal of the next frame is input. Note that when an image is displayed, since in response to a negative voltage being input to the threshold value control wiring line 16, the threshold values of the first short ring TFTs 9ea and 9ec and the second short ring TFTs 9eb and 9ed shift to positive according to the magnitude of the negative voltage, and the first short ring TFTs 9ea and 9ec and the second short ring TFTs 9eb and 9ed are turned oil, interference of a signal for display does not occur.

Next, a manufacturing method for the organic EL display device 50 according to the present embodiment will be described. Note that the manufacturing method for the organic EL display device 50 according to the present embodiment includes a TFT layer forming process, an organic EL element forming process, and a sealing film forming process.

TFT Layer Forming Process

First, for example, an inorganic insulating film (a thickness of approximately 50 nm) made of silicon oxide (SiOx), silicon nitride (SiNx), silicon oxynitride (SiOxNy; x>y), silicon nitride oxide (SiNxOy; x>y), or the like is formed on the resin substrate layer 10 formed on a glass substrate, for example, by a plasma Chemical Vapor Deposition (CVD) method to form the base coat film 11.

Next, after an aluminum film (a thickness of approximately 350 nm) and a molybdenum nitride film (a thickness of approximately 50 nm), for example, are sequentially formed by a sputtering method on the entire substrate on which the base coat film 11 is formed, photolithography, etching, and resist peeling processes are performed on the metal layered film to form the gate electrodes 12a and 12l, the lower conductive layer 12c, the gate line 12d, the light emission control line 12e, and the first gate electrodes 12fa, 12fb, 12ea, and 12da.

Then, an inorganic insulating film (a thickness of approximately 375 nm) made of a silicon oxide film (SiOx) or the like is formed on the entire substrate on which the gate electrode 12a and the like are formed by a plasma CVD method to form the first gate insulating film 13.

Furthermore, after an oxide semiconductor film (a thickness of approximately from 30 nm to 100 nm) made of InGaZnO$_4$ or the like, for example, is formed by a sputtering method on the entire substrate on which the gate insulating film 13 is formed, a photolithography process, an etching process, and a resist peeling process are performed on the oxide semiconductor film to form the semiconductor layers 14a, 14b, 14ca, and 14cb.

Next, after an inorganic insulating film (a thickness of approximately 150 nm) such as a silicon oxide film is formed by, for example, a plasma CVD method on the entire substrate on which the semiconductor layer 14a and the like are formed, an aluminum film (a thickness of approximately 350 nm) and a molybdenum nitride film (a thickness of approximately 50 nm) are sequentially formed by a sputtering method, and a photolithography process, an etching process, and a resist peeling process are performed on the metal layered film and inorganic insulating film to form the second gate insulating film 15, the threshold value control wiring line 16, and the second gate electrodes 16a and 16b.

Subsequently, the semiconductor layers 14a, 14b, 14ca, and 14cb are formed with the channel region 14cc, the source region 14cs, and the drain region 14cd by performing plasma treatment such as hydrogen plasma treatment or helium plasma treatment, for example, on the entire substrate on which the threshold value control wiring line 16 and the like are formed.

Furthermore, after a silicon nitride film (a thickness of approximately 100 nm) and a silicon oxide film (a thickness of approximately 100 nm) are formed by, for example, a plasma CVD method on the entire substrate on which the channel region 14cc and the like are formed, an aluminum film (a thickness of approximately 350 nm) and a molybdenum nitride film (a thickness of approximately 50 nm) are sequentially formed by a sputtering method, and then a photolithography process, an etching process, and a resist peeling process are performed on the metal layered film to form the upper conductive layer 18.

Subsequently, after a silicon nitride film (a thickness of approximately 100 nm) and a silicon oxide film (a thickness of approximately 100 nm) are formed by, for example, a plasma CVD method on the entire substrate on which the upper conductive layer 18 is formed, a photolithography process, an etching process, and a resist peeling process are performed on the layered inorganic insulating film to form the contact holes Ha to Hg, and the first interlayer insulating film 17 and the second interlayer insulating film 19 including the contact holes Ha to Hg are formed.

Furthermore, after a titanium film (a thickness of approximately 30 nm), an aluminum film (a thickness of approximately 300 nm), and a titanium film (a thickness of approximately 50 nm) are sequentially formed by, for example, a sputtering method on the entire substrate on which the second interlayer insulating film 19 is formed, a photolithography process, an etching process, and a resist peeling process are performed on the metal layered film to form the source lines 20f, the power source lines 20g, and the source contact layers 20h and 20i.

Finally, after a polyimide-based photosensitive resin film (a thickness of approximately 2 μm) is applied by, for example, a spin coating method or a slit coating method to the entire substrate on which the source lines 20f and the like are formed, pre-baking, exposing, developing, and post-baking are performed on the coating film to form the flattening film 21, and the TFT layer 30 is formed.

Organic EL Element Forming Process

The organic EL element 35 is formed by forming the first electrodes 31, the edge cover 32, the organic EL layers 33 (the hole injection layer 1, the hole transport layer 2, the tight-emitting layer 3, the electron transport layer 4, and the electron injection layer 5), and the second electrode 34 on the flattening film 21 of the TFT layer 30 that has been formed in the Tyr layer forming process, by using a known method.

Sealing Film Forming Process

First, an inorganic insulating film such as a silicon nitride film, a silicon oxide film, or a silicon oxynitride film is formed by a plasma CVD method on a substrate surface formed with the organic EL element 35 formed in the organic EL element forming process by using a mask to form the first inorganic film 36.

Next, on the substrate surface formed with the first inorganic film 36, a film made of an organic resin material such as acrylic resin is formed by, for example, using an ink-jet method to form the organic film 37.

Further, an inorganic insulating film such as a silicon nitride film, a silicon oxide film, or a silicon oxynitride film is formed by a plasma CND method on the substrate formed with the organic film 37 by using a mask to form the second inorganic film 38, thereby forming the sealing film 40.

Finally, after a protective sheet (not illustrated) is bonded on the substrate surface on which the sealing film 40 is formed, the glass substrate side of the resin substrate layer 10 is irradiated with laser light, the glass substrate is peeled off from a lower surface of the resin substrate layer 10, and then, a protective sheet (not illustrated) is bonded on the lower surface of the resin substrate layer 10 from which the glass substrate has been peeled.

The organic EL display device 50 of the present embodiment can be manufactured in the manner described above. Here, since the first gate electrode 12fa of the first short ring TFT 9ea and the first gate electrode 12fb of the second short ring TFT 9eb are floating electrodes, when an excessive voltage is applied to the source line 20f due to static electricity, the first short ring TFT 9ea or the second short ring TFT 9eb is turned on, and the excessive voltage is applied to the next source line 20f in sequence, thereby discharging the excessive voltage. In addition, since the first gate electrode 12da of the first short ring TFT 9ec and the first gate electrode 12ea of the second short ring TFT 9ed are floating electrodes, when an excessive voltage is applied to the gate line 12d or the light emission control line 12e due to static electricity, the first short ring TFT 9ec or the second short ring TFT 9ed is turned on, and the excessive voltage is applied to the next light emission control line 12e or gate line 12d in sequence, thereby discharging the excessive voltage.

As described above, according to the organic EL display device 50 of the present embodiment, the first short ring TFT 9ea provided between a pair of the adjacent source lines 20f includes the semiconductor layer 14ca, the first gate electrode 12fa provided closer to the resin substrate layer 10 than the semiconductor layer 14ca with the first gate insulating film 13 interposed therebetween, and the second gate electrode 16a provided closer to the organic EL element 35 than the semiconductor layer 14ca with the second gate insulating film 15 interposed therebetween. Here, one of the pair of the source lines 20f is electrically connected to the source region 14cs of the semiconductor layer 14ca, the other of the pair of the source lines 20f is electrically connected to the drain region 14cd of the semiconductor layer 14ca, the first gate electrode 12fa is electrically connected to the drain region 14cd of the semiconductor layer 14ca, and the second gate electrode 16a is electrically connected to the threshold value control wiring line 16. Additionally, the second short ring TFT 9eb provided between a pair of the adjacent source lines 20f includes the semiconductor layer 14cb, the first gate electrode 12fb provided closer to the resin substrate layer 10 than the semiconductor layer 14cb with the first gate insulating film 13 interposed therebetween, and the second gate electrode 16a provided closer to the organic EL element 35 than the semiconductor layer 14cb with the second gate insulating film 15 interposed therebetween. Here, one of the pair of the source lines 20f is electrically connected to the source region 14cs of the semiconductor layer 14cb, and the other of the pair of the source lines 20f is electrically connected to the drain region 14cd of the semiconductor layer 146, the first gate electrode 12fb is electrically connected to the source region 14cs of the semiconductor layer 14cb, and the second gate electrode 16a is electrically connected to the threshold value control wiring line 16. Therefore, when an excessive voltage is applied to the source line 20f due to static electricity during the manufacturing process, the first short ring TFT 9ea or the second short ring TFT 9eb is turned on, and the excessive voltage is applied to the next source line 20f in sequence, thereby discharging the excessive voltage. Additionally, when an image is displayed, since in response to a negative voltage being input to the threshold value control wiring line 16, the threshold values of the first short ring TFT 9ea and the second short ring TFT 9eb are shifted to positive, the first short ring TFT 9ea and the second short ring TFT 9eb are turned off, so interference of a signal for display does not occur. As a result, the first short ring TFT 9ea and the second short ring ITT 9eb for countermeasures against static electricity can remain incorporated in a product, so short rings free from being cut and removed can be provided in the organic EL display device 50.

In addition, according to the organic EL display device 50 of the present embodiment, the first short ring TFT 9ec provided between the gate line 12d and the light emission control line 12e that are adjacent to each other includes the semiconductor layer 14ca, the first gate electrode 12da provided closer to the resin substrate layer 10 than the semiconductor layer 14ca with the first gate insulating film 13 interposed therebetween, and the second gate electrode 16b provided closer to the organic EL element 35 than the semiconductor layer 14ca with the second gate insulating film 15 interposed therebetween. Here, the light emission control line 12e is electrically connected to the source region 14cs of the semiconductor layer 14ca, the gate line 12d is electrically connected to the drain region 14cd of the semiconductor layer 14ca, the first gate electrode 12da is electrically connected to the drain region 14cd of the semiconductor layer 14ca, and the second gate electrode 16b is electrically connected to the threshold value control wiring line 16. Furthermore, the second short ring ITT 9ed provided between the gate line 12d and the light emission control line 12e that are adjacent to each other includes the semiconductor layer 14cb, the first gate electrode 12ea provided closer to the resin substrate layer 10 than the semiconductor layer 14cb with the first gate insulating film 13 interposed therebetween, and the second gate electrode 16b provided closer to the organic EL element 35 than the semiconductor layer 14cb with the second gate insulating film 15 interposed therebetween. Here, the light emission control line 12e is electrically connected to the source region 14cs of the semiconductor layer 14cb, the gate line 12d is electrically connected to the drain region 14cd of the semiconductor layer 14cb, the first gate electrode 12ea is electrically connected to the source region lies of the semiconductor layer 14cb, and the second gate electrode 16b is electrically connected to the threshold value control wiring line 16. Therefore, when an excessive voltage is applied to the gate line 12d or the light emission control line 12e due to static electricity during the manufacturing process, the first short ring TFT 9ec or the second short ring TFT 9ed is turned on, and the excessive voltage is applied to the next light emission control line 12e or gate line 12c1 in sequence, thereby discharging the excessive voltage. Additionally, when an image is displayed, since in response to a negative voltage being input to the threshold value control wiring line 16, the threshold values of the first short ring TFT 9ec and the second short ring TFT 9ed are shifted to positive, the first short ring TFT 9ec and the second short ring TFT 9ed are turned off, so interference of a signal for display does not occur. As a result, the first short ring TFT 9ec and the second short ring TFT 9ed for countermeasures against static electricity can remain incorporated in a product, so short rings free from being cut and removed can be provided in the organic EL display device 50.

In addition, according to the organic EL display device 50 of the present embodiment, an end face of the lead-out wiring line is not exposed to a cutting surface cut into panel units, and this can suppress the application of an excessive voltage due to static electricity through the end face of the lead-out wiring line, or deterioration in the display region caused by deterioration of the wiring line due to moisture at the end face of the lead-out wiring line.

In addition, according to the organic EL display device 50 of the present embodiment, since the first short ring TFTs 9ea and 9ec and the second short ring TFTs 9ec and 9ed still remain even after being cut into panel units, electrostatic destruction after being cut into panel units can be suppressed. In particular, since a laminate film is attached to or peeled from the flexible organic EL display device 50, the electrostatic destruction at the time can be effectively suppressed.

In addition, according to the organic EL display device 50 of the present embodiment, since the first gate insulating film 13 is thicker than the second gate insulating film 15, the first short ring TFTs 9ea and 9cc and the second short ring TFTs 9eb and 9ed can be turned off at a small threshold value control voltage.

Second Embodiment

In the first embodiment described above, the organic EL display device 50 provided with the n-type TFT including the semiconductor layer made of an oxide semiconductor is exemplified, but an organic EL display device provided with a p-type TFT including a semiconductor made of, for example, low-temperature polysilicon may be applicable. In this case, when an image is displayed, the first short ring TFTs 9ea and Sec and the second short ring TFTs 9eb and 9ed may be turned off by inputting, for example, a high power supply voltage (ELVDD) as a positive voltage to the threshold value control wiring line 16.

Other Embodiments

In each of the embodiments described above, the organic EL layer having a five-layer structure including the hole injection layer, the hole transport layer, the light-emitting layer, the electron transport layer, and the electron injection layer is exemplified. The organic EL layer may have a three-layer structure including a hole injection-cum-transport layer, a light-emitting layer, and an electron transport-cum-injection layer.

In each of the embodiments described above, the organic EL display device including the first electrode as an anode and the second electrode as a cathode is exemplified. The disclosure is also applicable to an organic EL display device in which the layered structure of the organic EL layer are in a reverse order with the first electrode being a cathode and the second electrode being an anode. In this case, a low power supply voltage is input to a power source line.

In addition, in the embodiments described above, the organic EL display device in which the light emission control line is provided as the display wiring line is exemplified, but the disclosure can also be applied to an organic EL display device in which the light emission control line, the light emission control transistor, and the light emission control circuit are omitted.

In the embodiments described above, the organic EL display device in which the first gate electrode is the short circuit gate electrode, and the second gate electrode is the threshold value control gate electrode is exemplified, but the disclosure can also be applied to an organic EL display device in which the second gate electrode is the short circuit gate electrode and the first gate electrode is the threshold value control gate electrode.

In the above-described embodiments, the example of the organic EL display device in which the electrode of the TFT connected to the first electrode serves as the drain electrode is given. However, the disclosure is also applicable to an organic EL display device in which the electrode of the TFT connected to the first electrode is referred to as the source electrode.

In each of the embodiments described above, the organic EL display device is exemplified and described as a display device. The disclosure is also applicable to a display device including a plurality of light-emitting elements that are driven by an electrical current. For example, the disclosure is applicable to a display device including Quantum-dot Light Emitting Diodes (QLEDs) that are light-emitting elements using a quantum dot-containing layer.

INDUSTRIAL APPLICABILITY

As described above, the disclosure is useful for a flexible display device.

The invention claimed is:
1. A display device comprising:
a base substrate in which a display region configured to display an image and a frame region around the display region are defined;
a light-emitting element provided on a first surface of the base substrate, and configuring the display region;
a plurality of display wiring lines provided in the display region between the base substrate and the light-emitting element;
a plurality of lead-out wiring lines provided in the frame region between the base substrate and the light-emitting element and electrically connected to the plurality of display wiring lines, respectively, and
a short ring TFT disposed between a pair of adjacent lead-out wiring lines of the plurality of lead-out wiring lines,
wherein the short ring TFT includes a semiconductor layer including a channel region, and a source region and a drain region disposed sandwiching the channel region, a first gate electrode provided closer to the base substrate than the semiconductor layer and overlapping the channel region, a second gate electrode provided closer to the light-emitting element than the semiconductor layer and overlapping the channel region, a first gate insulating film provided between the semiconductor layer and the first gate electrode, and a second gate insulating film provided between the semiconductor layer and the second gate electrode,
one of the pair of adjacent lead-out wiring lines is electrically connected to the source region,
the other of the pair of adjacent lead-out wiring lines is electrically connected to the drain region,
one of the first gate electrode and the second gate electrode is a short circuit gate electrode electrically connected to the source region or the drain region, and
the other of the first gate electrode and the second gate electrode is a threshold value control gate electrode electrically connected to a threshold value control wiring line provided in the frame region.
2. The display device according to claim 1,
wherein two of the short ring TFTs are provided between the pair of adjacent lead-out wiring lines,
the short circuit gate electrode of one of the two short ring TFTs is electrically connected to one of the pair of adjacent lead-out wiring lines, and
the short circuit gate electrode of the other of the two short ring TFTs is electrically connected to the other of the pair of adjacent lead-out wiring lines.
3. The display device according to claim 2,
wherein the threshold value control wiring line branches toward the two short ring TFTs, and the branch wiring line branching from the threshold value control wiring line serves as a threshold value control gate electrode for the two short ring TFTs.
4. The display device according to claim 1,
wherein the plurality of lead-out wiring lines are electrically connected to a plurality of source lines provided as the plurality of display wiring lines, respectively.
5. The display device according to claim 4,
wherein the frame region is provided in a rectangular frame shape,
a terminal portion is provided on one side of the frame region, and
the short ring TFT is provided on a side opposite to the one side of the frame region on which the terminal portion is provided.
6. The display device according to claim 1,
wherein the plurality of lead-out wiring lines are electrically connected to a plurality of gate lines provided as the plurality of display wiring lines, respectively.

7. The display device according to claim 6,
wherein the frame region is provided in a rectangular frame shape,
a terminal portion is provided on one side of the frame region,
a gate signal control circuit is provided on two sides orthogonal to the one side of the frame region on which the terminal portion is provided, and
the short ring TFT is provided between the display region and the gate signal control circuit.

8. The display device according to claim 6,
wherein a light emission control line is provided as the plurality of display wiring lines between a pair of adjacent gate lines of the plurality of gate lines.

9. The display device according to claim 1,
wherein the plurality of lead-out wiring lines are electrically connected to a plurality of light emission control lines provided as the plurality of display wiring lines, respectively.

10. The display device according to claim 9,
wherein the frame region is provided in a rectangular frame shape,
a terminal portion is provided on one side of the frame region,
a light emission control circuit is provided on two sides orthogonal to the one side of the frame region on which the terminal portion is provided, and
the short ring TFT is provided between the display region and the light emission control circuit.

11. The display device according to claim 1,
wherein the semiconductor layer is provided shared by at least adjacent three lead-out wiring lines of the plurality of lead-out wiring lines.

12. The display device according to claim 1,
wherein a film thickness of the first gate insulating film between the short circuit gate electrode and the semiconductor layer is greater than a film thickness of the second gate insulating film between the threshold value control gate electrode and the semiconductor layer.

13. The display device according to claim 1,
wherein a length in a channel direction of the threshold value control gate electrode is greater than a length in a channel direction of the short circuit gate electrode.

14. The display device according to claim 1,
wherein the short ring TFT is an n-type transistor, and
in a case where an image is displayed, the threshold value control wiring line is configured to be input with a negative voltage.

15. The display device according to claim 14,
wherein the threshold value control wiring line is configured to be input with a low power supply voltage as the negative voltage.

16. The display device according to claim 1,
wherein the short ring TFT is a p-type transistor, and
in a case where an image is displayed, the threshold value control wiring line is configured to be input with a positive voltage.

17. The display device according to claim 16,
wherein the threshold value control wiring line is configured to be input with a high power supply voltage as the positive voltage.

18. The display device according to claim 1,
wherein the base substrate has flexibility.

19. The display device according to claim 1,
wherein the semiconductor layer is formed of an oxide semiconductor.

20. The display device according to claim 19,
wherein the oxide semiconductor is an In—Ga—Zn—O based oxide semiconductor.

* * * * *